United States Patent
Slater et al.

(10) Patent No.: US 9,690,506 B2
(45) Date of Patent: *Jun. 27, 2017

(54) VIRTUAL TAPE LIBRARY

(71) Applicant: HEWLETT PACKARD ENTERPRISE DEVELOPMENT LP, Houston, TX (US)

(72) Inventors: Alastair Slater, Chepstow (GB); Simon Pelly, Bristol (GB)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/074,087

(22) Filed: Mar. 18, 2016

(65) Prior Publication Data

US 2016/0202928 A1    Jul. 14, 2016

Related U.S. Application Data

(63) Continuation of application No. 12/351,164, filed on Jan. 9, 2009.

(51) Int. Cl.
*G06F 3/06* (2006.01)
*G06F 17/50* (2006.01)

(52) U.S. Cl.
CPC .......... *G06F 3/0619* (2013.01); *G06F 3/0607* (2013.01); *G06F 3/0664* (2013.01); *G06F 3/0665* (2013.01); *G06F 3/0686* (2013.01); *G06F 17/50* (2013.01)

(58) Field of Classification Search
CPC ....... G06F 3/0664; G06F 3/0686; G06F 17/50
See application file for complete search history.

(56) References Cited

U.S. PATENT DOCUMENTS

| 4,603,382 A | 7/1986 | Cole et al. |
| 4,642,759 A | 2/1987 | Foster |
| 4,947,367 A | 8/1990 | Chang et al. |
| 5,018,095 A | 5/1991 | Nissimov |
| 5,070,474 A | 12/1991 | Tuma et al. |
| 5,088,058 A | 2/1992 | Salsburg |
| 5,313,617 A | 5/1994 | Nakano et al. |
| 5,394,532 A * | 2/1995 | Belsan .................. G06F 3/0601 711/113 |
| 5,410,667 A | 4/1995 | Belsan et al. |

(Continued)

FOREIGN PATENT DOCUMENTS

| EP | 1544721 | 6/2005 |
| GB | 2431770 | 5/2007 |

*Primary Examiner* — Akash Saxena
(74) *Attorney, Agent, or Firm* — Trop, Pruner & Hu, P.C.

(57) ABSTRACT

In some examples, a local, non-tape based storage is to emulate tape storage elements at a first virtual tape library. A data structure associates first emulated tape storage elements of an emulated tape library with the storage elements in the first virtual tape library and associates second emulated tape storage elements of the emulated tape library with storage elements emulated by a remote storage in a second virtual tape library that is separate from the first virtual tape library, where the first virtual tape library is to present the emulated tape library that includes the storage elements of the first and second virtual tape libraries to a requesting entity that is separate from the first and second virtual tape libraries.

20 Claims, 7 Drawing Sheets

(56) References Cited

U.S. PATENT DOCUMENTS

| | | |
|---|---|---|
| 5,426,736 A | 6/1995 | Guineau, III |
| 5,455,926 A | 10/1995 | Keele et al. |
| 5,668,976 A | 9/1997 | Zook |
| 5,680,539 A | 10/1997 | Jones |
| 6,049,848 A | 4/2000 | Yates et al. |
| 6,094,605 A | 7/2000 | Blendermann et al. |
| 6,119,174 A | 9/2000 | Borowsky et al. |
| 6,157,963 A | 12/2000 | Courtright et al. |
| 6,269,410 B1 | 7/2001 | Spasojevic |
| 6,330,621 B1 | 12/2001 | Bakke et al. |
| 6,421,723 B1 | 7/2002 | Tawil |
| 6,473,809 B1 | 10/2002 | Aref et al. |
| 6,490,648 B1 | 12/2002 | Kaneda et al. |
| 6,606,585 B1 | 8/2003 | Golding et al. |
| 6,704,839 B2 | 3/2004 | Butterworth et al. |
| 6,725,456 B1 | 4/2004 | Bruno et al. |
| 6,732,171 B2 | 5/2004 | Hayden |
| 6,738,386 B1 | 5/2004 | Holmqvist |
| 6,745,207 B2 | 6/2004 | Reuter et al. |
| 6,782,372 B1 | 8/2004 | Cooper et al. |
| 6,816,917 B2 | 11/2004 | Dicorpo et al. |
| 6,832,186 B1 | 12/2004 | Margulieux |
| 6,845,403 B2 | 1/2005 | Chadalapaka |
| 6,865,527 B2 | 3/2005 | Go et al. |
| 6,874,060 B2 | 3/2005 | Blood et al. |
| 6,880,052 B2 | 4/2005 | Lubbers et al. |
| 6,912,588 B2 | 6/2005 | Jardin et al. |
| 6,952,734 B1 | 10/2005 | Gunlock et al. |
| 6,978,259 B1 | 12/2005 | Anderson et al. |
| 7,035,971 B1 | 4/2006 | Merchant |
| 7,127,575 B2 | 10/2006 | Kano |
| 7,293,179 B2 | 11/2007 | Johnson |
| 7,359,848 B1 | 4/2008 | Nourmohamadian et al. |
| 7,430,570 B1 | 9/2008 | Srinivasan et al. |
| 7,444,465 B2 | 10/2008 | Matze et al. |
| 7,536,596 B2 | 5/2009 | Johnson |
| 7,636,801 B1 | 12/2009 | Kekre et al. |
| 7,822,961 B2 | 10/2010 | Cepulis et al. |
| 8,046,446 B1 | 10/2011 | Karr et al. |
| 8,370,833 B2 | 2/2013 | Bolles et al. |
| 8,612,561 B2 | 12/2013 | Ni |
| 8,621,178 B1 | 12/2013 | Lazar |
| 2002/0004796 A1 | 1/2002 | Vange et al. |
| 2002/0035664 A1 | 3/2002 | Yates |
| 2002/0103923 A1 | 8/2002 | Cherian et al. |
| 2002/0188592 A1 | 12/2002 | Leonhardt et al. |
| 2002/0199205 A1 | 12/2002 | Sonawane et al. |
| 2003/0061362 A1 | 3/2003 | Qiu et al. |
| 2003/0204597 A1 | 10/2003 | Arakawa et al. |
| 2003/0208284 A1 | 11/2003 | Stewart et al. |
| 2003/0236942 A1 | 12/2003 | Kishi et al. |
| 2004/0044842 A1 | 3/2004 | Trimmer |
| 2004/0078185 A1 | 4/2004 | Briggs et al. |
| 2004/0098244 A1 | 5/2004 | Dailey et al. |
| 2004/0139240 A1 | 7/2004 | DiCorpo et al. |
| 2004/0177228 A1 | 9/2004 | Leonhardt et al. |
| 2004/0194095 A1 | 9/2004 | Lumb et al. |
| 2004/0230724 A1 | 11/2004 | Stager |
| 2005/0033911 A1 | 2/2005 | Kitamura et al. |
| 2005/0193235 A1 | 9/2005 | Sandorfi et al. |
| 2006/0200623 A1 | 9/2006 | Gonzalez et al. |
| 2007/0255920 A1 | 11/2007 | Gold |
| 2010/0058465 A1 | 3/2010 | Johnson |
| 2010/0180074 A1 | 7/2010 | Slater et al. |
| 2010/0306462 A1 | 12/2010 | Otsuka |
| 2012/0144107 A1 | 6/2012 | Asher |

* cited by examiner

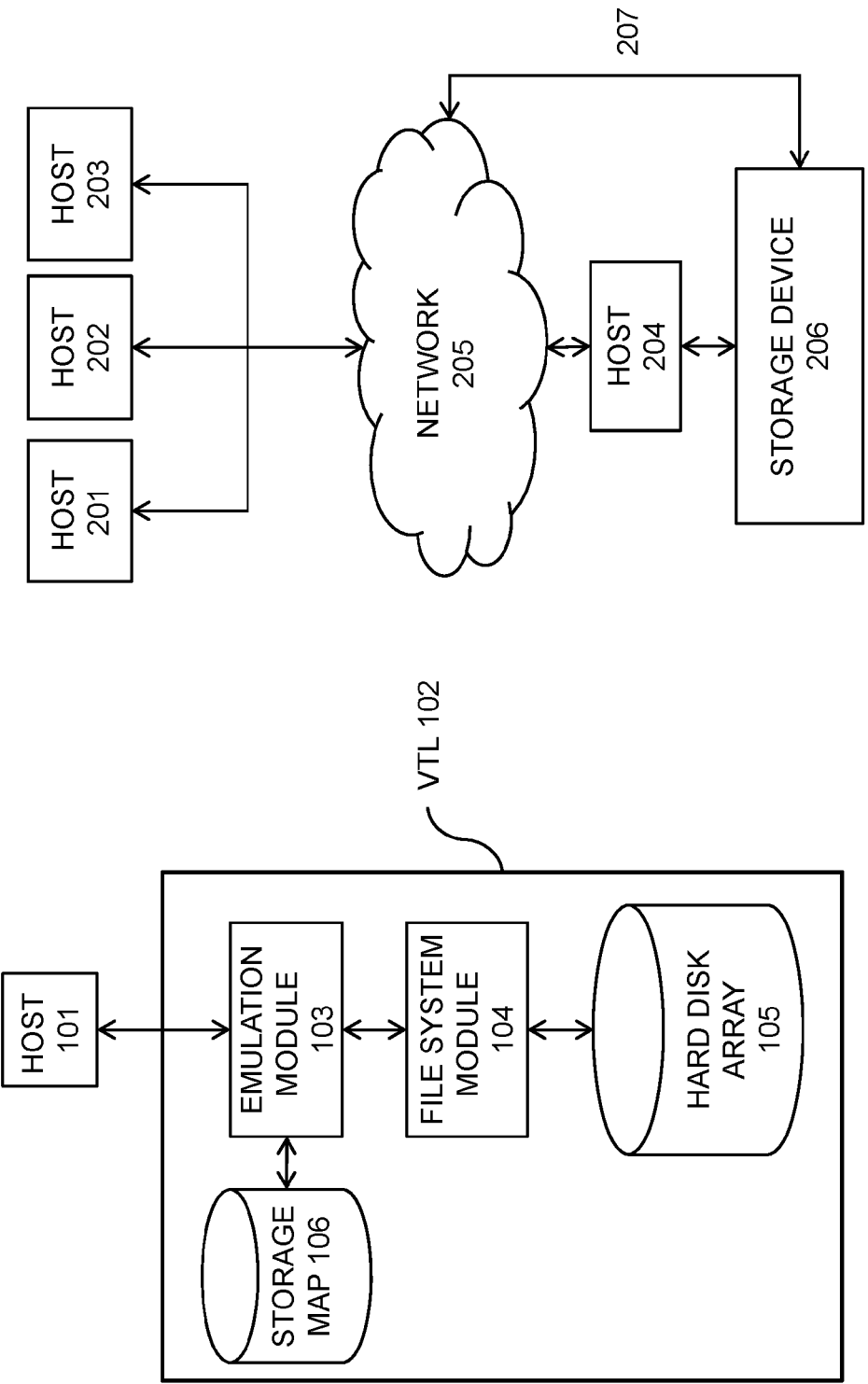

VIRTUAL TAPE LIBRARY

CROSS-REFERENCE TO RELATED APPLICATION

This is a continuation of U.S. application Ser. No. 12/351,164, filed Jan. 9, 2009, which is hereby incorporated by reference.

BACKGROUND

Media for large scale data storage can generally be classified as either tape-based sequential access media or disk-based random access media. Storage devices which utilise tape-based media are typically used for backup and archival storage of large datasets. Data stored on a tape medium typically comprises backed up data files, which are structured in sequential records or blocks and delimited by file mark data. Due to its sequential nature, a tape must be wound past all preceding data and file marks in order to read from or write to any particular location or file, a process which inevitably leads to severe speed penalties compared with systems employing disk-based random access media. Nevertheless, where a primary requirement is for data archiving, the high capacity, longevity and relative low cost of tape media has meant that systems based on tape-based sequential access media, for example conventional tape libraries, have remained a popular choice for many users.

A conventional tape library typically stores data on tape media, in the form of tape cartridges, and can be defined in terms of its geometry. Generally, a geometry comprises a number of addressable 'elements' namely: storage elements (slots), for storing inactive cartridges; one or more data transfer elements (tape drives), for reading and writing data respectively from and to loaded cartridges; and one or more medium transport elements (robot pickers), for moving cartridges between designated slots and drives. Some conventional tape libraries may have additional geometry elements such as one or more import/export elements (mailslots), for receiving new cartridges into the library or delivering existing cartridges out from the library.

Conventional tape libraries are typically accessed and controlled by storage application software running on a host computer, which is attached (either directly, or indirectly via a network) to a library. The application software typically maintains a record of where in a library particular data has been stored, typically by reference to a particular cartridge in a particular slot. The application software also controls the library to store and retrieve data using commands identifying the associated geometry elements. For example, a read operation typically involves a move medium command followed by a read command. The move medium command controls a picker to move a selected cartridge (e.g. tape cartridge number 0001) stored in a particular slot to a specified drive so that particular data may be read from the cartridge and returned to the host.

Advances in hard disk storage technology have over the years reduced the density and cost per megabyte differential between disk media and tape media, thus promoting disk media as a viable alternative to tape media in some circumstances. However, there still exist legacy data storage software applications that are designed to operate with sequential-access tape devices and libraries conforming to a defined geometry. Often, an organisation may have invested significantly in application software, skills and management processes for tape-based backup and restore activities. In some such circumstances, it has proved beneficial to utilise disk-based random-access storage technologies in storage systems that remain compatible with legacy tape-based sequential access storage applications. Storage systems of this type are known as Virtual Tape Libraries (VTL) and emulate conventional tape libraries such that storage application software is unaware that an expected physical tape library has been replaced with an emulation thereof. Such storage systems typically replace physical tape media with one or more random access hard disks or disk arrays (which will hereinafter be referred to generally as "disk storage"), translating commands based on library elements into commands suitable for storing data on disk.

FIG. 1 shows an example prior art VTL in functional form. A host 101 is operably connected to a VTL 102, which comprises an emulation module 103, a file system module 104, disk storage 105 and a storage map 106, which may be stored on the disk storage 105 and loaded into volatile memory such as RAM (not shown) for quick access while the system is in operation. Typically, the host 101 executes storage application software configured to interact with a conventional tape library of defined geometry. When a read or write operation is initiated, the host 101 sends respective tape library commands to the VTL 102 using an appropriate protocol (for example a Small Computer System Interface (SCSI) protocol), which, in turn, may be over iSCSI or Fibre Channel. The emulation module 103 receives the host commands and converts them into commands for the file system module 104 so that the appropriate data can be read from or written to the disk storage 105. The emulation module 103 converts from library commands to disk commands based on the map 106, which maps library data, received from the host 101 in terms of library elements and logical locations (e.g. cartridges, records and file marks etc.), to a data representation that can be stored on a disk subsystem (e.g. disk, volume and sector etc.).

SUMMARY

According to a first aspect, the present invention provides a virtual tape library apparatus providing a plurality of emulated tape storage elements, the apparatus comprising: local, non-tape based storage; a store storing a data structure which associates the emulated tape storage elements with the local or remote storage; a first interface to provide access to the local storage, in response to tape library commands identifying emulated tape storage elements associated with the local storage; a second interface to provide access to the remote storage, in response to tape library commands identifying emulated tape storage elements associated with the remote storage; and a command processor, which receives tape library commands relating to emulated storage elements, and generates respective commands for the remote storage when received library commands relate to the remote storage.

According to a second aspect, the present invention provides a virtual tape library apparatus providing a plurality of emulated tape storage elements, the apparatus comprising: local, non-tape based storage; a store storing a data structure which associates emulated tape storage elements with the local storage and indicates which, if any, of the emulated tape storage elements are readable from and/or writable to by a remote storage device; a first interface to provide access to the local storage in response to tape library commands received from a host and identifying emulated tape storage elements associated with the local storage; and a second interface to provide access by a remote storage device to emulated tape library elements that, according to the data structure, can be read from and/or written to by a remote storage device.

According to a third aspect, the present invention provides a storage system comprising local non-tape based storage means, means for mapping a plurality of emulated storage elements of the system to either the local storage means or a remote storage means, means for accessing the local or remote storage means according to the mapping for reading and writing data from and to the emulated storage elements.

BRIEF DESCRIPTION OF THE DRAWINGS

Various embodiments of the present invention will now be described, by way of example only, with reference to the accompanying drawings, of which:

FIG. 1 is a block diagram of a prior art emulated storage device;

FIG. 2 is a block diagram of a networked computing environment which includes a back-up storage system;

DETAILED DESCRIPTION

Figure 3:
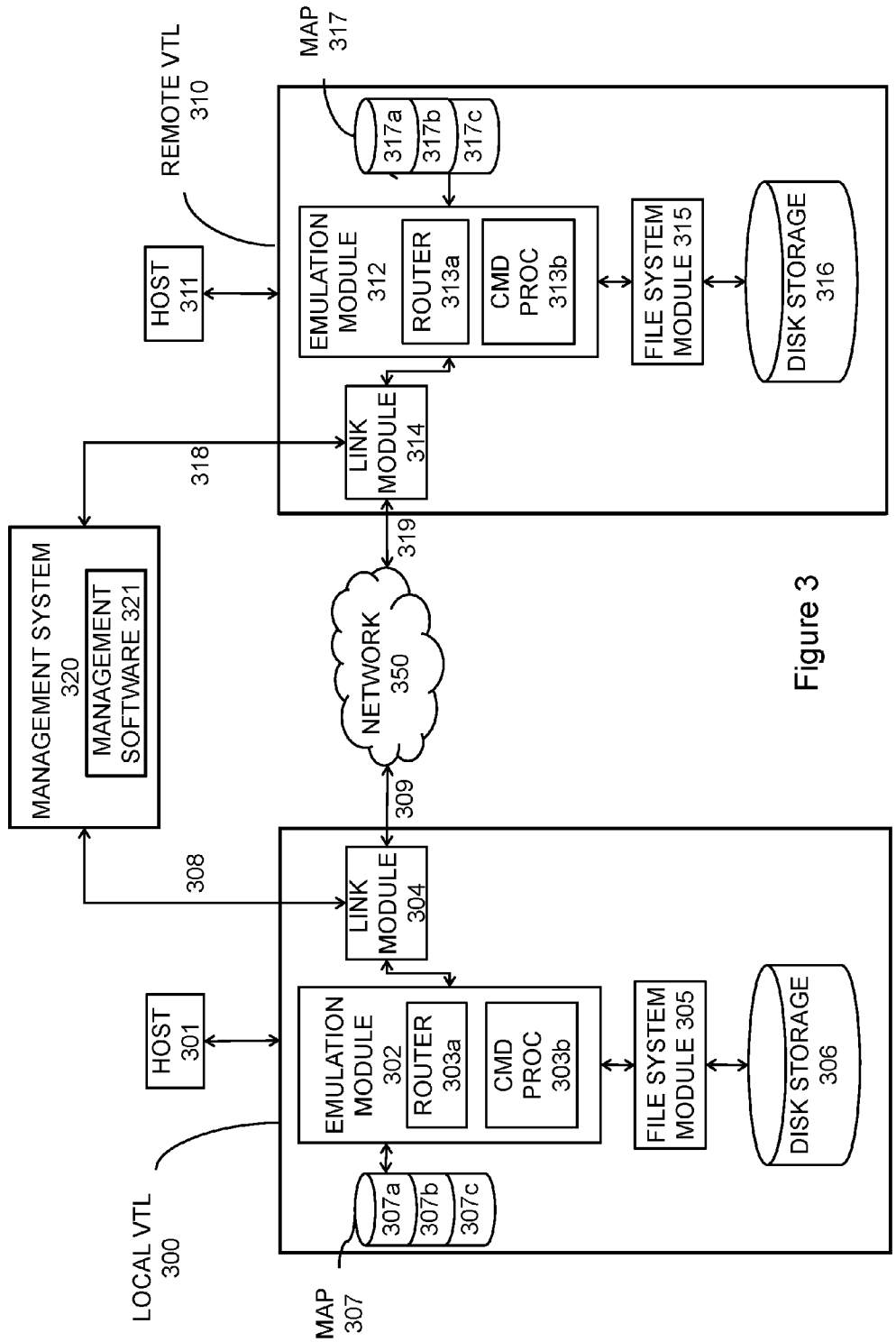
FIG. 3 is a block diagram of two linked storage devices according to an embodiment of the present invention.

Various embodiments of the present invention will now be described in more detail with reference to the accompanying figures. It will be appreciated that the invention is not limited in its application, to the details of construction and the arrangement of components as set forth in the following description or illustrated in the drawings. It will be understood by a person skilled in the art that additional embodiments of the present invention not detailed in the description are possible without departing from the scope or intention of the present invention. Accordingly, the following description should not be interpreted as limiting in any way, and all such embodiments are intended to fall within scope of the present invention.

As used herein, the term "host" refers to any computer comprising at least one processor—such as a personal computer, a workstation, a mainframe or a networked client—which is capable of executing storage application software and communicating with other devices, such as a storage system or other computers. In addition, within this disclosure, the term "networked computer environment" includes any computing environment in which a plurality of hosts are mutually connected via a network connection using, for example, TCP/IP over Ethernet, or Fibre Channel protocol layers or other suitable network technology or combination of network technologies. Moreover, embodiments of the present invention may also be used in conjunction with at least one higher level protocol layer using, for example, SCSI commands, or any other suitable commands for communicating with a target. FIG. 2 illustrates an exemplary networked computer environment comprising a plurality of hosts 201-204, a network 205 and a storage device 206. The storage device 206 may be connected to the network via a host 204, or alternatively (or in addition), it may be connected directly to the network 205 (i.e. being network attached storage, "NAS") via a connection 207.

As used herein, the terms "emulated" and "virtual" are used interchangeably. An "emulated" device, apparatus, element, geometry or system denotes a device, apparatus, element, geometry or system implemented in software or hardware, or a combination thereof, such that the emulated device, apparatus, element or system behaves in substantially the same functional manner to that of a conventional (that is, a non-emulated) equivalent, from the point of view of a host. For example, whilst being implemented using different technology, a virtual tape cartridge is functionally the same as a conventional tape cartridge from the perspective of a connected host.

Prior art VTLs suffer from the drawback that they are often constrained, at least to some extent, by the geometry "expected" by the storage application software running on a host; where the expected geometry may be referred to as a target geometry. Legacy storage application software running on one or more hosts may be tailored to specifically access a legacy tape library. Consequently, if a known VTL or a conventional tape library with a different geometry is connected to the host(s), the storage application software may require time consuming reconfiguration. For example, the "expected" number of drive and picker/robotics elements may be constrained, whereas the number of slot elements may not. In addition, configuration of a prior art VTL can be a lengthy process requiring configuration of each element forming the emulated library, and expansion of the storage may not be possible without reconfiguring respective host storage application software. Embodiments of the present invention therefore facilitate linking between a first, or local VTL—that is, the VTL that presents an emulated tape library to a host—and a second, or remote VTL, such that remote emulated slots and media on the remote VTL can be accessed via the first VTL seamlessly (that is, without any indication by the first VTL of whether elements are local or remote) by a host that is connected only to the first VTL.

To facilitate this, linking functionality is provided such that the local VTL may be linked to a remote VTL in order to obtain access to the additional emulated storage elements. Linking of one or more remote storage devices is performed within the constraints of the target geometry (albeit an extended target geometry) presented to the host by the local VTL, in order to obviate reconfiguration of the host(s)' storage application software.

FIG. 3 shows the functional elements of an embodiment of the present invention comprising a local VTL 300 connected to a remote VTL 310. In this example, the VTLs are functionally the same and are connected via a network 350, which may be a local area network or a wide area network, although the VTLs may be connected directly to one another instead. In a typical application of the present embodiment, local and remote VTLs may be located in different buildings, cities, countries or even continents.

A host 301 is operably connected to the local VTL 300, which comprises an emulation module 302, a link module 304, a file system module 305, disk storage 306 and a map 307. According to the present embodiment, the emulation module 302 contains a router 303a and a command processor 303b. The link module 304 comprises a control interface 308, and a data interface 309 for communicating with a remote VTL 310, as will be described below. The host 301 runs conventional storage application software configured to interact with a conventional tape library of defined target geometry. When a read or write operation is executed, the host 301 sends respective commands to the local VTL 300, for example, using a SCSI protocol; though, in principle, other suitable protocols, such as Fibre Channel, SATA or iSCSI, may be used. Hereafter, unless stated otherwise, it will be assumed that the protocol referred to for communications between the host 301 and local VTL 300 is a standard SCSI protocol.

In common with the local VTL 300, the remote VTL 310 comprises an emulation module 312, a link module 314, a file system module 315, disk storage 316 and a map 317. According to the present embodiment, the emulation module 312 of the remote VTL 310 contains a router 313a and a command processor 313b, and the link module 314 comprises a control interface 318 and a data interface 319 for communicating with the local VTL 300.

The disk storage 306 and 316 comprises one or more disk drives and/or arrays, which may comprise a plurality of commercial-off-the-shelf (COTS) disk products (and may be relatively inexpensive compared to conventional storage array products).

The host 301 communicates with the local VTL 300 using a variety of standard tape library commands, which may include: moving a cartridge from a slot to a drive (a MOVE_MEDIUM command), and reading status information of the storage device (a READ_ELEMENT_STATUS command, which reports (among other things), which elements are present at which address).

With reference to the local VTL 300, the file system module 315 provides a first functional interface between the storage application software running on the host 301 and (via the emulation module 302) the disk storage 306. The emulated library is represented in the map 307, which is accessible to the emulation module 302. The map 307 is a data structure that represents the emulated library in terms of one or more addressable elements. According to the present embodiment, the map 307 contains data providing two levels of associations (or mappings) 307a and 307b. The map 307 provides first associations 307a indicating whether emulated slots are local emulated slots, which reside on the local VTL 300, or remote emulated slots, which reside on the remote VTL 310. Where appropriate, the mapping 307b provides second associations between data stored on local emulated cartridges of the local VTL 300 and respective logical locations in the file system of the disk storage 306. By 'logical locations' we mean, for example, disk volume, directory name, file name etc. Optional mappings 307c, details of which will be discussed below, define which local emulated slots can be accessed for read and/or write access by the remote VTL 310. The file system module 305 is responsible for mapping between logical file system designations and physical locations in the disk storage 306 in a known way.

Thus, the emulation module 302 can, in response to appropriate commands from the host 301, and with reference to the map 307, render or present the emulated library to the host as one or more addressable elements of a conventional tape-based library.

The link module 304 provides a second functional interface between the host 301 and (via the emulation module 302) the remote VTL 310. The link module 304 provides a data interface 308, for connecting the VTL 300 to the remote VTL 310, such that commands and data can be communicated back and forth between the local VTL 300 and the remote VTL 310. The link module 304 also provides a control interface 308, which provides access to the VTL 300 for configuration purposes, as will be described below. When linked to a remote VTL 310 via the data interface 309, commands for accessing emulated storage elements of the remote VTL 310 are communicated by the link module 304 to the remote storage device using an appropriate protocol. The access commands may be standard tape library access commands or may, instead, be bespoke commands provided for communicating between VTLs, as will be described in more detail hereafter.

The router 303a of the emulation module 302 contains logic that determines, by reference to the first associations 307a of the map 307, whether commands received from the host 301 relate to emulated slots of the local VTL 300 or to emulated slots of the remote VTL 310. By virtue of the first associations 307a and the router 303a, the emulation module 302 can appropriately route commands to the local disk storage 306 or to the remote VTL 310.

If no remote VTL is linked via data interface 309 to the local VTL 300, the map 307 reflects this by omitting (or in some other way rendering the elements inaccessible) all associations with the remote VTL 310. In this way, the emulation module 302 presents to the host 301 only the emulated storage elements that are currently associated with the storage medium 306 of the local VTL 300. It is possible, therefore, that emulated storage elements that are available to the host 301 on one day (when the remote VTL 310 is attached) may not be available at another time (for example, if the remote VTL 310 is subsequently detached or goes off-line).

Configuration of the VTL 300 is performed via the control interface 308. The control interface 308 typically comprises a separate physical connection, for example a USB connection, between the local VTL 300 and a management system 320 executing a management software application 321. In some embodiments, configuration of the local VTL 300 may be performed by a management software application running on the (or another) host 301. According to the present embodiment, a user (who manages the local VTL 300) is presented by the management software application 321 with a graphical user interface (GUI) such that linking parameters may be specified, including but not limited to specification of which remote storage devices are linked, which media are linked, etc. Further details of the management software application 321 will be provided below.

In order to facilitate routing of commands from the host 301 attached to the local VTL 300, an emulated library is represented, in terms of one or more addressable storage elements, by a dataset forming part of the data structure stored in the map 307 of the local VTL 300. In this example, the dataset defines a mapping from the addressable storage elements of the emulated tape library to respective emulated elements of the local VTL 300 and elements of the remote VTL 310.

Figure 4:
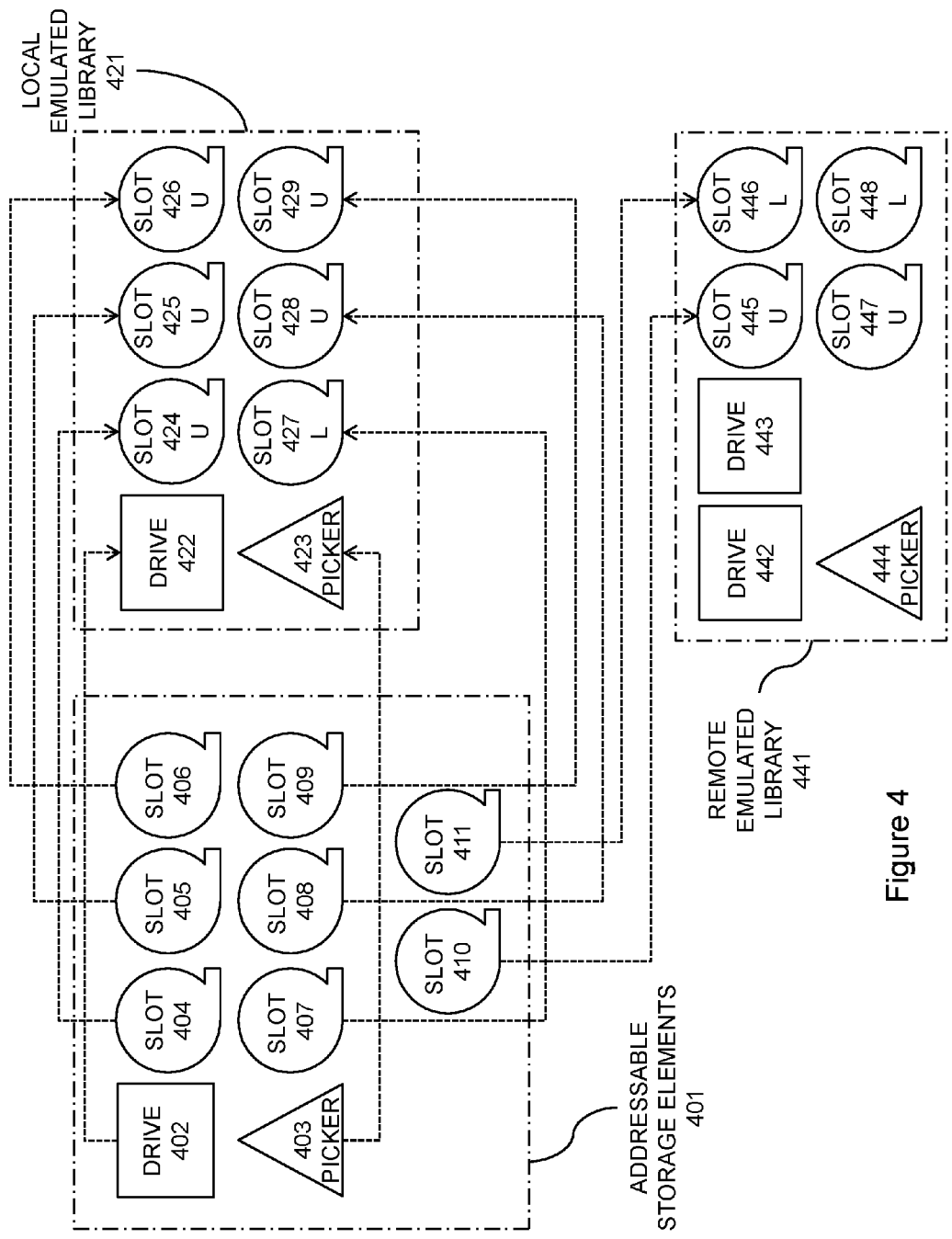
FIG. 4 is a block diagram of the functional relationship between addressable emulated storage elements and local and remote emulated storage elements according to an embodiment of the present invention.

FIG. 4 illustrates in graphical form an exemplary data structure showing the addressable storage elements 401 of an emulated tape library, which is stored in the map 307 of the local VTL 300; in particular, in the mapping 307a of map 307. In effect, the map 307 maps the emulated elements of the emulated tape library, to the emulated elements of a local emulated library 421 of the local VTL 300 and to the emulated elements of a remote emulated library 441 of the remote VTL 310.

The local emulated library 421 comprises emulated elements including a drive 422, a picker 423 and six cartridge slots 424-429. The remote emulated library 441 comprises emulated elements including two drives 442 and 443, a picker 444 and four cartridge slots 445-448. In FIG. 4, it is assumed that all emulated cartridge slots of both VTLs contain emulated cartridges (424-429 and 442-448), although, in alternative embodiments, one or more slots can be empty (no cartridge contained therein). As also shown in FIG. 4, the emulated slots of the local and remote emulated libraries each have a lock status—locked "L" or unlocked "U"—the purpose of which will be described below.

In FIG. 4, an emulated drive 402 and an emulated picker 403 map to the local emulated drive 422 and local emulated picker 423 respectively. Similarly, a first plurality of emulated slots 404-409 map to local emulated slots 424-429 and a second plurality of emulated slots 410 and 411 map to the remote emulated slots 445 and 446 on the remote VTL 310. Thus, the emulated tape library 401 has been expanded, beyond the number of slots available on the local VTL 300 by being linked to additional slots from the remote emulated library of the remote VTL 310. For simplicity, the remote emulated slots linked to the emulated library are reported as new higher numbered slots (carrying on the from extant slot count of the local emulated library). Thus, a host querying the geometry of the local VTL (using, for example, a READ_ELEMENT_STATUS command) would "see" a drive 402, a picker 403 and eight slots 404-411 (each containing a cartridge), in accordance with the plurality of addressable storage elements 401.

It will be appreciated that the emulated library has a geometry that conforms to the target geometry of the local emulated library, by having one drive 402 and one picker 423. This is despite the fact that the remote VTL 310 would normally expect to receive commands with reference to a specified emulated slot, cartridge, drive and picker. In the present embodiment, the command processor 303b of the emulator 302 in the local VTL 300 is arranged to convert a command that is associated with a local emulated picker and drive, and a remote emulated slot, into a command (intended for the remote VTL 310) referring to a remote emulated picker, drive and slot. The command processor 303b uses the map to re-write the commands, or generate new commands, destined for the remote VTL 310, such that the commands make sense to the remote VTL 310 for its emulated geometry.

The local VTL 300 may communicate with the remote VTL 310, for data read and write operations, using standard tape library commands, whereby the remote VTL 310 can treat the local VTL as if it were a normal host. As shown in FIG. 3, the commands are received by the remote VTL 310 via the link module 314; however, they could equally be received via a standard host interface if the remote VTL 310 is network attached or if the local VTL is connected to the remote VTL as a host. In any case, if the local VTL 300 communicates with the remote VTL 310 using standard tape library commands, the command processor 303b only needs to translate the target emulated element identity from that identified by the host 301 to that required by the remote VTL 310. In principle, however, the two VTLs could be adapted to communicate with one another using any other kind of appropriate protocol, and the command processor 303b would then need to re-write library commands received from the host 301 as commands according to the respective protocol. Command re-writing (or translation) of this kind is well known. In any case, the command processor 313b of the remote VTL 310 is arranged to receive whatever commands are sent by the local VTL and convert them (if necessary) into commands usable directly by the remote VTL 310 subsystems. Likewise, the command processor 303b of the local VTL 300 is arranged to receive responses from the remote VTL 310 and convert them (if necessary) into responses for the host 301. Command conversion in general is well known.

Figure 5:
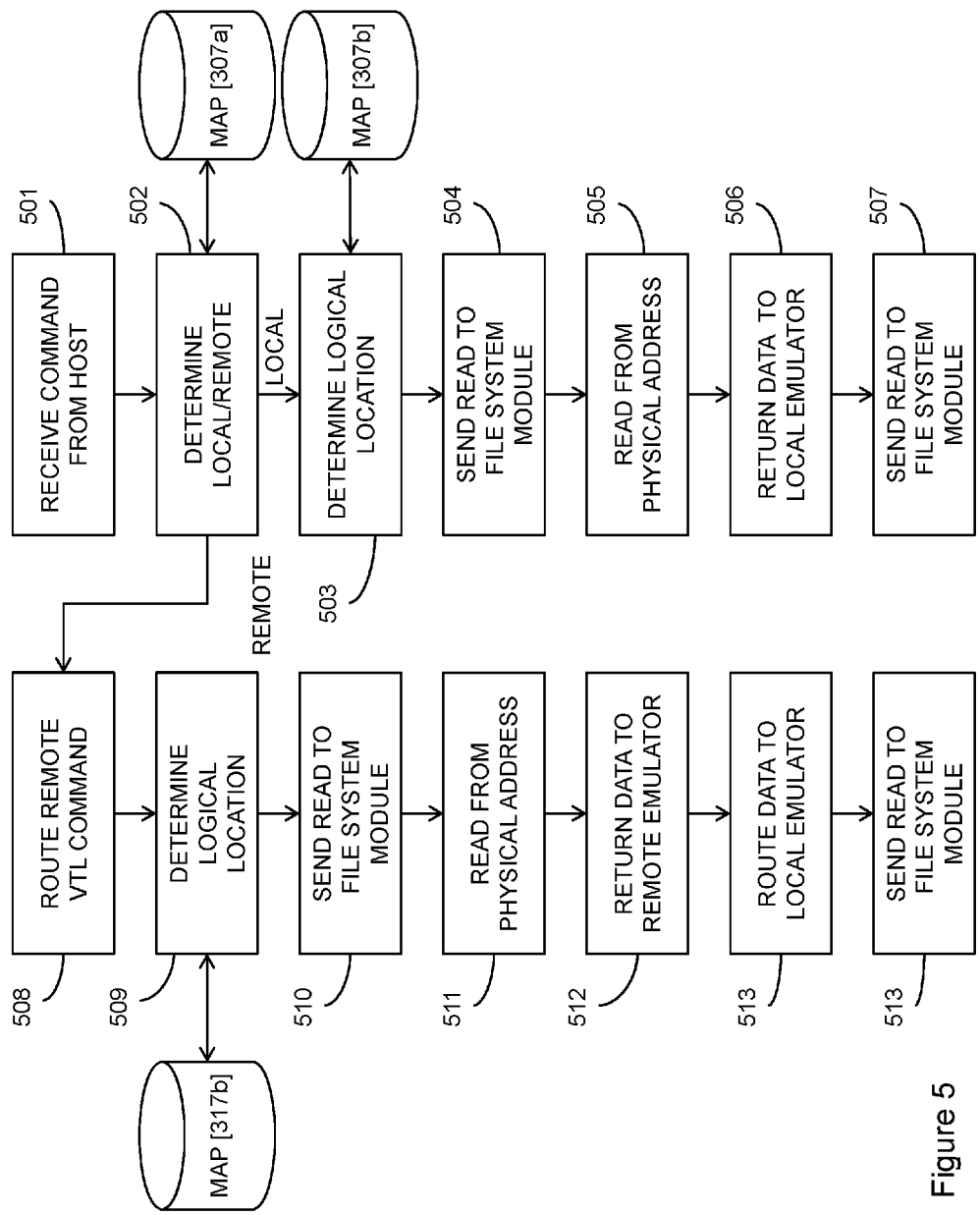
FIG. 5 is a flow diagram of a method of routing a request from a host device.

One example of the mapping function described in the preceding paragraphs is illustrated in the flow diagram in FIG. 5, and is performed by the router 303a with reference to the map 307. By querying the associations contained in mappings 307a and 307b, the router 303a can appropriately map commands to either the disk storage 306 of the local VTL 300 or to the linked remote VTL 310. According to FIG. 5, if a library command is received from the host 301 [step 501] and relates to reading data from an emulated cartridge in emulated slot 404, the router 303a determines from the mapping 307a [step 502] that the emulated slot 404 is a local emulated slot 424, which is associated with the local disk storage 306. The router 303a also then determines the logical location on the disk storage 306 of the associated data by reference to the mapping 307b [step 503]. The emulator 302 of the local VTL 300 (the local emulator) then passes an associated disk read request to the file system module 305 [step 504], which converts the logical location to a physical disk address and reads the data from the physical address of the disk storage 306 [step 505]. The file system module 305 returns the data to the local emulator 302 [step 506], which returns the data to the host 301 [step 507] in a format expected by the host. Alternatively [step 502], if the library command received from the host 301 relates to reading data from an emulated cartridge in emulated slot 410, the router 303a determines from the mapping 307a that the emulated slot 410 is a remote emulated slot 445, which is associated with the remote VTL 310. The command processor 303a then generates a read command for the remote VTL 310, identifying the remote emulated slot 445 and the required data, and the emulator 302 communicates the command to the remote VTL 310 [step 508]. The remote VTL 310 receives the command and the command processor 313b and the router 313a of the remote VTL 310 determine the associated logical location of the data on the remote disk storage 316, with reference to the associated mapping 317b [step 509]. The emulator 312 of the remote VTL 310 (the remote emulator 312) then passes an associated disk read request to the file system module 315 [step 510], which converts the logical location to a physical disk address and reads the data from the physical address of the remote disk storage 316 [step 511]. The file system module 315 returns the data to the remote emulator 312 [step 512], which routes the data back to the local emulator 302 [step 513], which in turn, by way of the command processor 303b, returns the data to the host 301 [step 514] in a format expected by the host.

In the present embodiment, optional mapping 307c of the map 307 provides data defining which emulated slots of the local VTL 300 are linkable to the remote VTL 310. This feature dictates whether linking between the local VTL 300 and remote VTL 310 is uni-directional (so that the local VTL can link to the remote VTL but not vice versa) or bi-directional (so that each VTL can link to the other). A sub-set of zero or more of the local emulated slots can be defined in mapping 307c as linkable to a remote VTL 310, such that a command associated with a local emulated slot received from the remote VTL 310 will be routed to the appropriate emulated slot on the local VTL 300 by emulation module 302 and router 303a.

According to the present embodiment, mapping 307c also contains data defining a lock status ("L" designating locked and "U" designating unlocked) of each linkable slot. In response to a command to access a particular slot received from the host 301 or the remote VTL 310, the lock status of the associated local emulated slot is changed by the emulator 302 from unlocked to locked, during the period of the access, so that no other access request is permitted on the emulated slot. In other words, the host is not permitted to access a local emulated slot if the remote VTL 310 is already accessing it and, likewise, the remote VTL 310 is not permitted to access a local emulated slot if the host is already accessing it.

As discussed, the emulated slots shown in FIG. 4 may or may not contain an emulated tape cartridge at any particular time. In the embodiment described, all slots contain media and the local VTL 300 linking to slots in the remote VTL 310 gains access to the emulated cartridges by selecting said linked slots. In other embodiments, a local VTL may link to more or even all slots in a remote VTL. In either case, emulated cartridges contained in a slot of the remote VTL, which is linked to the local VTL, may be included in both the emulated geometry of the local VTL and an emulated geometry of the remote device, thus being accessible to a host or hosts connected to either of the VTLs. Alternatively, emulated cartridges contained in a slot of the remote VTL, which is linked to the local VTL, may be excluded from the emulated geometry of the remote VTL. It will be appreciated that, in principle, any emulated cartridge of one VTL may be accessible to that VTL and/or to another VTL according to a configuration option. However, where emulated cartridges can be accessed by more than one VTL, basic rules need to be applied to which VTL takes precedence during a read or write operation. A simple rule is 'first-come-first served', whereby the first host or VTL to access the emulated slot obtains control until the read or write operation is completed and the respective emulated cartridge has been returned to its emulated slot.

For example, in the present embodiment, when the local VTL 300 requests access to an emulated cartridge in a linked emulated slot (for example using a MOVE_MEDIUM command to move the emulated cartridge to an emulated drive) of the remote VTL 310, the respective emulated slot is locked such that it can only be accessed by the local host 301 and not by any other host. Alternatively, if the required emulated slot is already locked when a command is received, then it will not be available for access by the requesting host. In general, according to the present embodiment, once locked, any emulated slot will not appear as available to other hosts (for example in response to a READ_ELEMENT_STATUS command), and the respective cartridge may be reported as being absent from the slot, for example due to its being loaded in an emulated drive.

Figure 6:
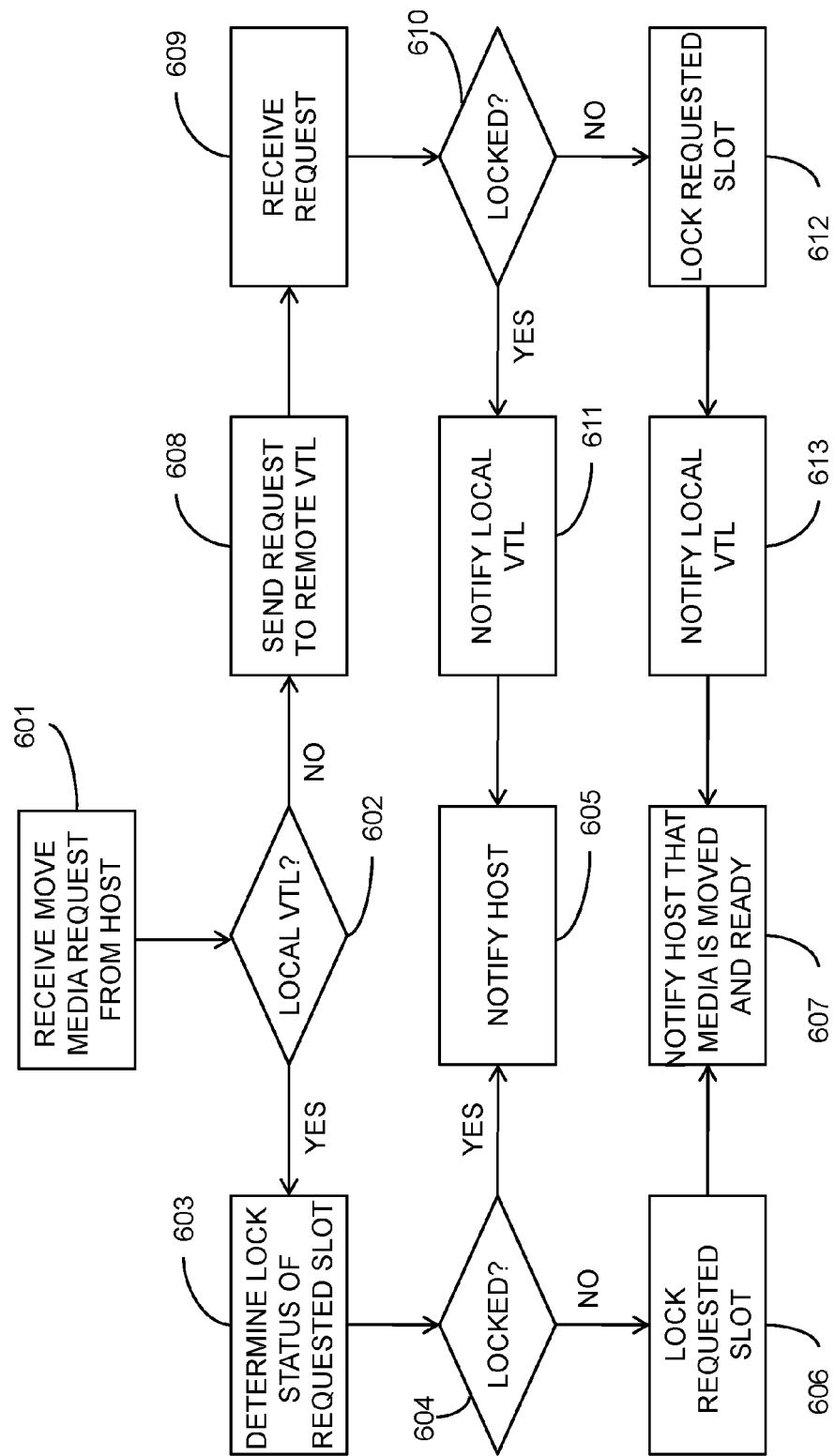
FIG. 6 is a flow diagram of a method of requesting access to a stored cartridge on a local or remote storage device according to an embodiment of the present invention.

A method of routing an access request from a local host 301 in accordance with an embodiment of the present invention is illustrated in the flow diagram in FIG. 6. According to FIG. 6, the local VTL 300 receives a MOVE_MEDIUM request from the local host 301 [step 601]. The local VTL 300 determines [step 602] if the slot associated with the requested cartridge is a local emulated slot (i.e. stored on the local disk storage 306) or a remote emulated slot (i.e. stored on the disk storage 316 of the remote VTL 310), by reference to the map 307. If the emulated slot is a local emulated slot, the local VTL 300 determines the lock status of the slot [step 603]. For example, emulated slot 427 is shown as locked "L" and emulated slot 428 is shown as unlocked "U". If the required slot is locked [step 604], the local VTL 300 notifies the local host 301 that the requested cartridge and associated slot are currently unavailable [step 605]. If the slot is not locked, the local VTL 300 locks the requested slot [step 606], to prevent access by other hosts, by updating the respective lock status to "L". Next [step 607], the local VTL 300 notifies the host 301 that the cartridge has been moved as requested, and is ready for a next operation by the host 301.

Alternatively, if the emulated slot is determined [step 602] to be a remote emulated slot in the remote VTL 310, the local VTL 300 sends a MOVE_MEDIUM request to the remote VTL [step 608]. The remote VTL 310 receives the request [step 609] and, in response, determines if the identified emulated slot is locked [step 610]. If the emulated slot is locked, then the remote VTL 310 reports back to the local VTL [step 611], which in turn notifies the local host 301 that the requested cartridge and associated slot are currently unavailable [step 605]. If the emulated slot is not locked then the remote VTL 310 locks the emulated slot, by updating the respective lock status to "L" [step 612]. Next, the remote VTL 310 notifies the local VTL 300 [step 613], and the local VTL 300 notifies the local host 301 [step 607], that the emulated cartridge has been moved as requested, and is ready for a next operation by the host 301. The emulated slot, whether it is local or remote, remains locked until the local host 301 has finished carrying out the intended read or write operation and has subsequently returned the emulated cartridge to its emulated slot, at which point the lock status is changed to unlocked and the cartridge and associated slot become accessible by other hosts. In effect, according to the present embodiment, a READ_ELEMENT_STATUS command or a MOVE_MEDIUM command can only be successful if the target emulated cartridge is resident in its emulated slot.

Figure 7:
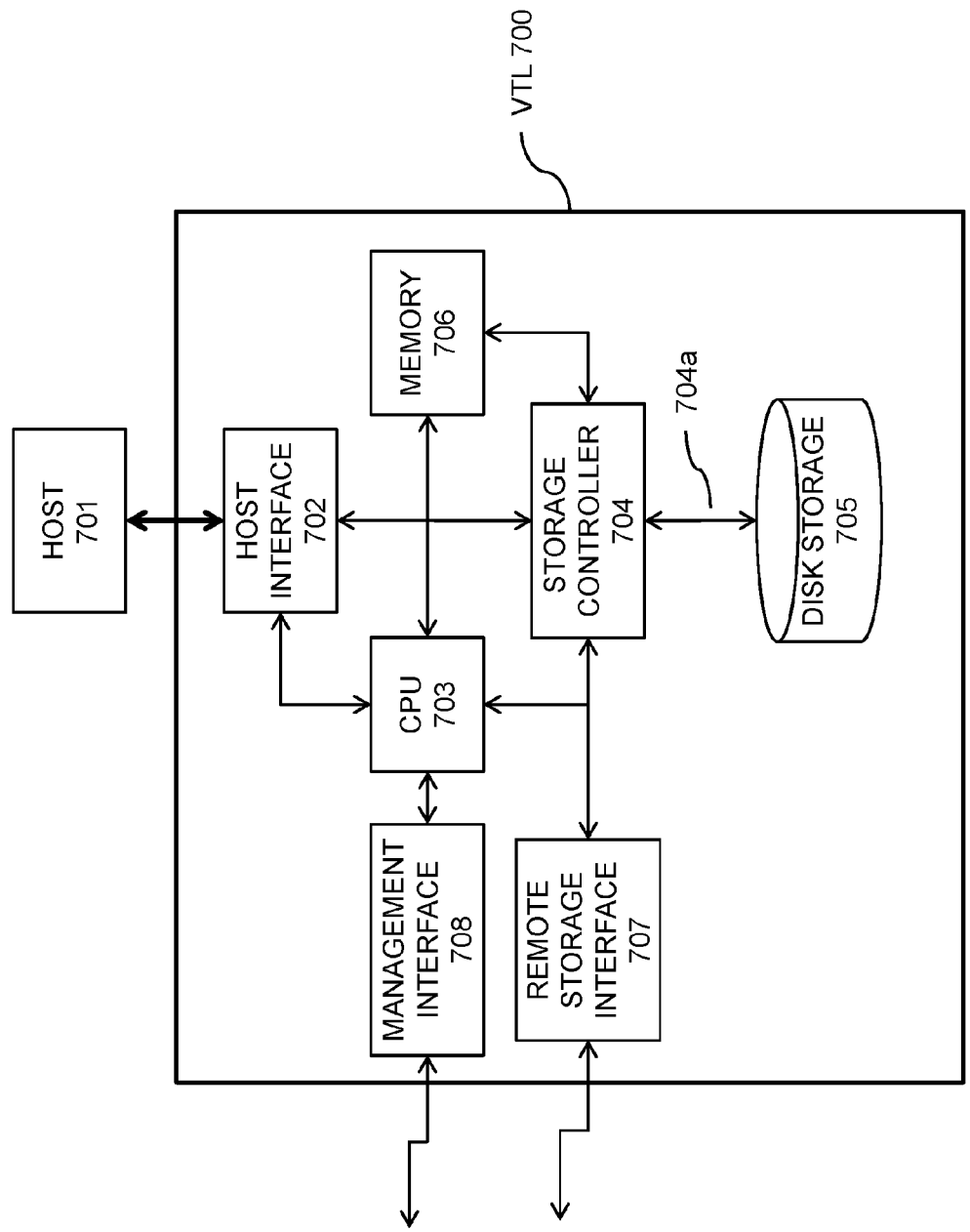
FIG. 7 is a block diagram showing components of a storage system according to an embodiment of the invention.

According to the present embodiment, the VTLs represented functionally in FIG. 3 comprise the main hardware components represented in the block diagram in FIG. 7. Referring to FIG. 7, a VTL 700 according to the present embodiment includes a storage controller 704 that is connected via an appropriate interface 704a to disk storage 705. The storage controller 704 enacts all reading and writing operations. The storage controller 704 is a dedicated processor, such as an ASIC, which is programmed to handle high speed read and write operations according to the requirements of the VTL 700. The storage controller 704 is also connected to a central processor unit (CPU) 703 and to main memory 706 (such as RAM, EEPROM, Flash memory etc.). The central processor 703 is a general purpose programmable processor, such as an Intel Pentium™ processor, which controls the overall operation of the VTL 700 and all of its components according to a control program, which is stored in and loaded from the disk storage 705 (or, alternatively, but not limited to flash memory or from elsewhere) into main memory 706 when the system is initiated (booted). The control program code may be written in any of a plurality of suitable programming languages including Java, C++, C#, or combinations thereof. A person skilled in the art will realise that the present invention is not limited to a particular programming language. Apart from storing control program instructions, the main memory 706 stores the map 307 and mappings 307a-307c, comprising all data representing the emulated library and emulated target geometry, including the associations with the local and remote emulated storage elements and the logical disk locations. The VTL 700 also includes a host interface 702, a linked storage interface 707 and a management interface 708. The host interface 702 is arranged to interact with a host 701 (directly or via a network) according to an appropriate protocol: commands sent by a host 701 to the host interface 702 are passed to the central processor 703, which then controls the storage controller 704 to enact respective read or write operations, the data for which passes directly through the storage controller 704 and not via the central processor 703. The linked storage interface 707 provides connectivity (either directly or via a network) with one or more other VTLs or other kinds of remote storage equipment. The management interface 708 provides connectivity (directly or via a network) with a management system 320 running management application software 321.

The functional elements of, for example, the local VTL 300 illustrated in FIG. 3 do not necessarily have a one-to-one correlation with the components that are illustrated in FIG. 7. For example, the emulator 302 may incorporate at least some aspects of the functionality of the host interface 702, the CPU 703, the storage controller 704 and the memory 706; the actual logical arrangement if the functional blocks being variable and a matter of design choice. The router function 303a and the command processing function 303b of the emulator 302 are, however, not speed-critical (compared with reading and writing data, which would be speed-critical), and so may be embodied in software executed by the CPU 703 rather than in instructions executed by the ASIC. In any event, many different arrangements of components from that shown in FIG. 7 are possible for implementing embodiments of the present invention and will become apparent to the skilled person. For example, the entire architecture may be implemented as a dedicated ASIC, obviating the central processor.

Figure 8:
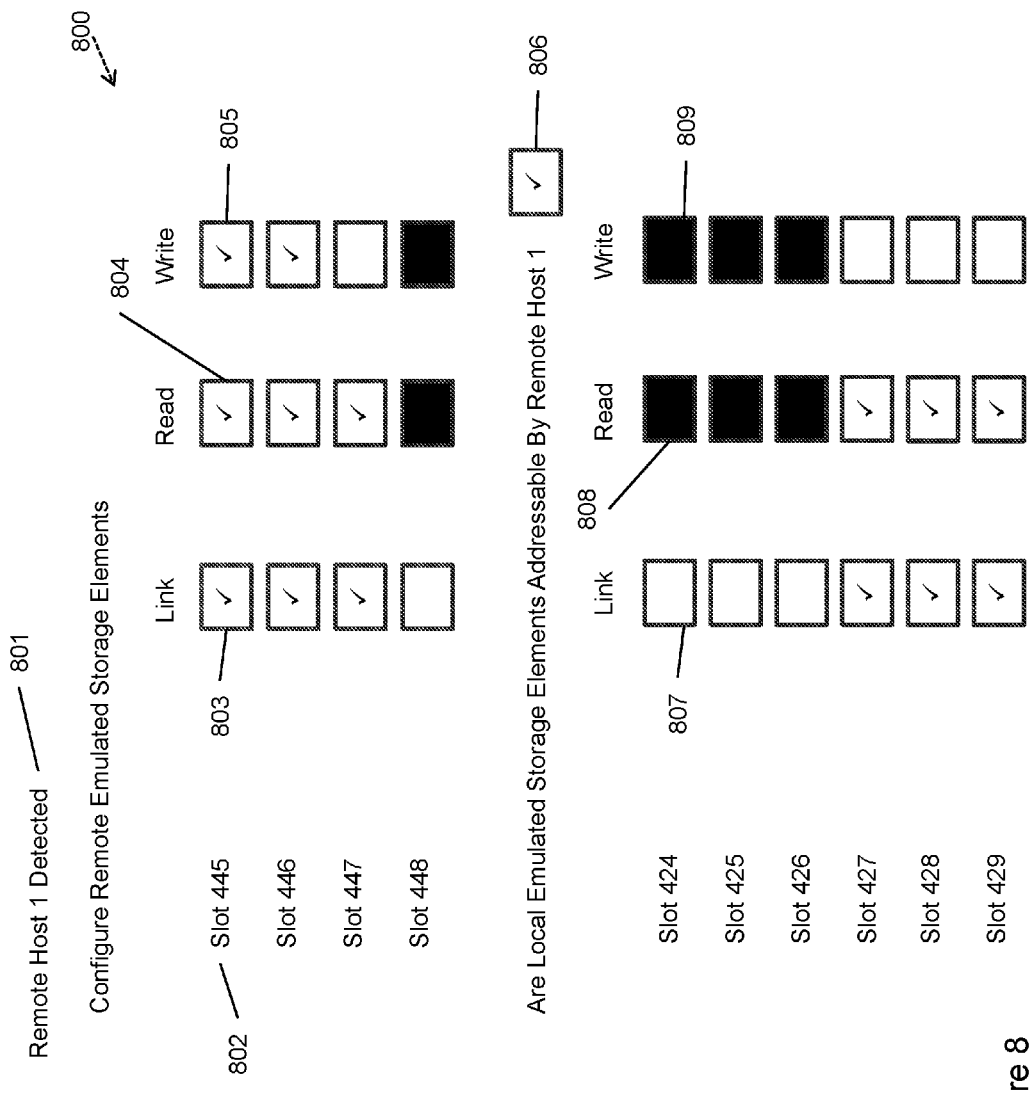
FIG. 8 is a representation of a graphical user interface for configuring an embodiment of the present invention.

An example of a GUI for configuring a local VTL to link with a remote VTL will now be described with reference to the diagram in FIG. 8. The GUI 800 is generated by software and presented to a user of the management system 320, who wishes to configure the linking characteristics of the local VTL. When the local and remote VTLs are connected, the user is presented with the GUI 800 indicating 801 that Remote Host 1 (in this example the remote VTL) has been detected and, in this example, which elements have been detected. Using the emulated media designations identified in FIG. 4, the emulated slots 802 of the remote VTL (Slot 445 to Slot 448), which can be linked to by the local VTL, are listed in the GUI. Against each emulated slot are three tick boxes, which are 'ticked' or 'un-ticked' by positioning a mouse pointer over the boxes and clicking a control button of the mouse in a standard way. The first 'Link' tick box 803 determines whether the respective media item of the remote VTL should be linked to by the local VTL. A tick in the respective Link box 803 implies "yes", whereas the absence of a tick implies "no". If the Link box 803 has no tick then the subsequent boxes 804 and 805 are rendered inoperative (shown as being blanked-out) and cannot be used. If a tick is present in the Link tick box 803, then the next two tick boxes, a 'Read' tick box 804 and a 'Write' tick box 805, can also be ticked if required. A tick in the Read tick box 804 dictates that the respective remote emulated cartridge can be linked to, for reading purposes, by the local VTL. A tick in the Write tick box 805 dictates that the respective remote emulated cartridge can be linked to, for writing purposes, by the local VTL. Absence of a tick in a tick box precludes the indicated operation. As shown in FIG. 8, emulated slots 445 and 446 can be both read from and written to by the local VTL, whereas emulated slot 447 can only be read from and emulated slot 448 cannot be read from or written to by the local VTL.

A second, optional aspect of the GUI 800, according to the present embodiment, is the ability to dictate whether or not local emulated cartridges (424-429) of the local VTL can be accessed by the remote VTL. This feature dictates whether linking is uni-directional (so that the local VTL can link to the remote VTL but not vice versa) or bi-directional (so that each VTL can link to the other). As shown, the user has an option, in the form of a tick box 806, to select whether the remote VTL can link to the local VTL: a tick meaning "yes". In no tick is added then, although not illustrated, the remainder of the GUI below the tick box 806 would remain inoperative to the user. However, as shown, the tick box 806 includes a tick and the GUI below remains operative. Each local emulated media has three associated tick boxes: a Link tick box 807, a Read tick box 808 and a Write tick box 809. These three tick boxes have the same purpose as the tick boxes associated with the remote emulated slots. As shown in FIG. 8, local emulated slots 424, 425 and 426 of the local VTL are not accessible by the remote VTL, whereas slots 427, 428 and 429 are accessible by the remote VTL. However, these latter media are only accessible by the remote VTL for read operations, as only the Read tick boxes 808 are ticked. In other words, there is an asymmetric, bi-directional relationship between the local and remote VTLs, in which the local VTL can read from and write to at least some emulated media of the remote VTL but the remote VTL can only read from selected emulated media of the local VTL.

The configuration specified by the GUI 800 is used by the management system to configure the respective local VTL 300 by generating an extended emulated target geometry comprising addressable storage elements 401 for the local VTL 300, which is stored in the respective map 307. A similar GUI would be provided for each remote VTL (or other storage device) that is attached to (or can be addressed by) the local VTL. As such, individual storage elements of remote storage devices can be selectively linked to the local VTL, in order to extend the emulated target geometry of the emulated library. In addition, selected storage elements of the local VTL can be linked to (that is, made available for access by) remote storage devices.

In principle, the second, optional aspect of the GUI 800 may in fact be the only configurable option of a VTL. For example, the remote VTL 310 in FIG. 3 may be configurable according to the second aspect of the GUI 800, to allow one or more of its emulated elements to be accessed by another VTL, but may not support the first aspect of the GUI to permit a host connected to it to access emulated elements of the primary VTL 300. In other words, in this case, the remote VTL 310 can only act as a non-extendable emulated library for hosts attached to it, whereas the local VTL 300 can be extended, for hosts attached to it, by gaining access to linked emulated storage elements of the remote VTL 310.

The above embodiments are to be understood as illustrative examples only. Further embodiments of the invention are envisaged. For example, the local and remote emulated libraries can be housed within the same device and/or the same non-tape-based storage media. It will be understood that the disk storage 306 and 316 may be replaced or augmented by non-disk technologies and/or alternative non-sequential storage technologies (e.g. optical or solid state semiconductor based storage). According to the embodiments described herein, a local VTL is linked to a remote VTL. However a person skilled in the art will understand that the present invention can be adapted to interface with any suitable remote storage device, including (but not limited) to a conventional VTL or even a tape library. Moreover, embodiments of the present invention encompass arrangements with more than two storage devices being mutually linked such that a host device connected to a local VTL can seamlessly access storage elements stored on a plurality of remote storage devices. In such an arrangement, the plurality of devices may be connected in a known way, for example via an Ethernet network using an iSCSI protocol, to facilitate exchange of data between devices. Furthermore, according to other embodiments of the invention, storage elements on a local device can be duplicated to a remote device without any necessary change in process at the host originating without any necessary change in process at the originating host.

Thus, according to some embodiments, it is possible to share an emulated cartridge stored on a VTL such that it can effectively exist in one or more remote emulated libraries, and be accessed by multiple remote hosts that are attached to the remote emulated libraries. In alternative scenarios, it may be favoured to dedicate an emulated cartridge to use by only one host (which could be a local or a remote host), but permit multiple hosts to access different emulated cartridges. Looking at this in another way, a single host can be attached to a local VTL, according to an embodiment, and the VTL has flexibility to access emulated cartridges located in other VTLs, for example, in remote locations, whereby the apparent expansion capability of the VTL is, within theoretical bounds, limitless. This kind of solution presents a way to deal with short term storage requirement increases, which may arise until a local VTL has been upgraded with additional physical storage. In addition, or alternatively, such an arrangement can provide a way to balance storage requirements across an enterprise, which has multiple VTLs at different sites, but where each site has different and, perhaps, variable storage requirements. In this case, if the combined storage capacity of the VTLs is sufficient for the needs of the enterprise, but some sites consume more storage than others, it may be more cost-efficient to share remote emulated cartridges with those storage-hungry sites than to meet the actual capacity requirements thereof. A significant advantage of embodiments of the invention is the ability for a VTL to act as a slave device, by permitting access to its storage by another VTL, while, at the same time, remain active as a master (or primary) device to hosts that interact therewith. In any event, advantageously, embodiments of the invention provide significantly increased flexibility when optimising access to storage distributed across a plurality linked VTL devices.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A first virtual tape library comprising:
a local, non-tape based storage for emulating tape storage elements;
a store to store a data structure which associates a first subset of emulated tape storage elements of an emulated tape library with the storage elements in the first virtual tape library and which associates a second subset of emulated tape storage elements of the emulated tape library with corresponding storage elements emulated by remote storage in a second virtual tape library that is separate from the first virtual tape library, wherein the first virtual tape library is to present the emulated tape library that includes the storage elements of the first and second virtual tape libraries to a requesting entity that is separate from the first and second virtual tape libraries; and
at least one interface to receive, from the requesting entity, first tape library commands identifying emulated tape storage elements, and second tape library commands identifying emulated tape storage elements; and
at least one processor to:
determine, from the data structure, that the emulated tape storage elements identified in the first tape library commands are associated with the first virtual tape library, and that the emulated tape storage elements identified in the second tape library commands are associated with the second virtual tape library that includes the remote storage separate from the local storage.

2. The first virtual tape library of claim 1, wherein the first tape library commands are commands to read data, and the second tape library commands are commands to read data.

3. The first virtual tape library of claim 1, wherein the data structure further includes associations between data of storage elements of the first virtual tape library and logical locations on the local, non-tape based storage.

4. The first virtual tape library of claim 3, comprising a file system to associate the logical locations of the local, non-tape based storage to physical locations of the local, non-tape based storage.

5. The first virtual tape library of claim 1, wherein the at least one processor is to further:
in response to determining that the emulated tape storage elements identified in the first tape library commands are associated with the first virtual tape library, generate respective local storage requests to access data at the local, non-tape based storage;
in response to determining that the emulated tape storage elements identified in the second tape library commands are associated with the second virtual tape library, generate respective remote storage requests to access data at the remote storage in the second virtual tape library.

6. The first virtual tape library of claim 5, comprising a router to route the local storage requests, via a first interface, to the local, non-tape based storage, and to route the remote storage requests, via a second interface, to the remote storage.

7. The first virtual tape library of claim 1, wherein the local, non-tape based storage comprises disk storage.

8. The first virtual tape library of claim 1, wherein the data structure further indicates which of the first subset of emulated tape storage elements can be read from or written to by the second virtual tape library.

9. The first virtual tape library of claim 8, wherein the data structure further includes lock status data, which is set to prevent access to a particular storage element of the first or second virtual tape library if the particular storage element is already being accessed.

10. A method comprising:
emulating, by a local, non-tape based storage, tape storage elements at a first virtual tape library;
storing, at the first virtual tape library, a data structure that associates first emulated tape storage elements of an emulated tape library with the storage elements in the first virtual tape library and associates second emulated tape storage elements of the emulated tape library with storage elements emulated by a remote storage in a second virtual tape library that is separate from the first virtual tape library, wherein the first virtual tape library is to present the emulated tape library that includes the storage elements of the first and second virtual tape libraries to a requesting entity that is separate from the first and second virtual tape libraries;

determining, by accessing the data structure, whether an emulated tape storage element identified in a first tape library command to read data received from the requesting entity is associated with the first virtual tape library; and determining, by accessing the data structure, whether an emulated tape storage element identified in a second tape library command to read data received from the requesting entity is associated with the second virtual tape library.

11. The method of claim 10, further comprising:

in response to determining that the emulated tape storage element identified in the first tape library command is associated with the first virtual tape library, generating a local storage request to access data at the local, non-tape based storage; and in response to determining that the emulated tape storage element identified in the second tape library command is associated with the second virtual tape library but not the first virtual tape library, generating a remote storage request to access data at the remote storage that is separate from the local, non-tape based storage.

12. The method of claim 10, wherein the data structure further includes associations between the data of storage elements of the first virtual tape library and logical locations on the local, non-tape based storage.

13. The method of claim 12, further comprising associating, by a file system, the logical locations of the local, non-tape based storage to physical locations of the local, non-tape based system.

14. The method of claim 10, further comprising:

routing, by a router, the local storage requests, via a first interface, to the local, non-tape based storage; and routing, by the router, the remote storage requests, via a second interface, to the remote storage.

15. The method of claim 10, wherein the data structure further indicates which of the first subset of emulated tape storage elements can be read from or written to by the second virtual tape library.

16. The method of claim 15, wherein the data structure further includes lock status data, which is set to prevent access to a particular storage element of the first or second virtual tape library if the particular storage element is already being accessed.

17. A non-transitory storage medium storing instructions that upon execution cause a first virtual tape library to:

emulate, by a local, non-tape based storage, tape storage elements at a first virtual tape library;

store a data structure that associates first emulated tape storage elements of an emulated tape library with the storage elements in the first virtual tape library and associates second emulated tape storage elements of the emulated tape library with storage elements emulated by a remote storage in a second virtual tape library that is separate from the first virtual tape library, wherein the first virtual tape library is to present the emulated tape library that includes the storage elements of the first and second virtual tape libraries to a requesting entity that is separate from the first and second virtual tape libraries;

determine, by accessing the data structure, whether an emulated tape storage element identified in a first tape library command to read data received from the requesting entity is associated with the first virtual tape library; and determine, by accessing the data structure, whether an emulated tape storage element identified in a second tape library command to read data received from the requesting entity is associated with the second virtual tape library.

18. The non-transitory storage medium of claim 17, wherein the instructions upon execution cause the first virtual tape library to:

in response to determining that the emulated tape storage element identified in the first tape library command is associated with the first virtual tape library, generate a local storage request to access data at the local, non-tape based storage; and in response to determining that the emulated tape storage element identified in the second tape library command is associated with the second virtual tape library but not the first virtual tape library, generate a remote storage request to access data at the remote storage that is separate from the local, non-tape based storage.

19. The non-transitory storage medium of claim 17, wherein the data structure further includes associations between data of storage elements of the first virtual tape library and logical locations on the local, non-tape based storage.

20. The non-transitory storage medium of claim 17, wherein the data structure further indicates which of the first subset of emulated tape storage elements can be read from or written to by the second virtual tape library.

* * * * *